US006764898B1

United States Patent
En et al.

(12) United States Patent
(10) Patent No.: US 6,764,898 B1
(45) Date of Patent: Jul. 20, 2004

(54) IMPLANTATION INTO HIGH-K DIELECTRIC MATERIAL AFTER GATE ETCH TO FACILITATE REMOVAL

(75) Inventors: William G. En, Milpitas, CA (US); Joong S. Jeon, Cupertino, CA (US); Minh Van Ngo, Fremont, CA (US); Ming-Ren Lin, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 20 days.

(21) Appl. No.: 10/147,690

(22) Filed: May 16, 2002

(51) Int. Cl.[7] .......................... H01L 21/8242
(52) U.S. Cl. .................. 438/240; 438/723; 438/756
(58) Field of Search .................. 438/240, 705, 438/722, 756, 743, 723

(56) References Cited

U.S. PATENT DOCUMENTS 6,121,155 A     9/2000  Yang et al. .................. 438/725
6,475,842 B1 *  11/2002 Cheah et al. ................ 438/197
6,580,118 B2 *  6/2003  Ludwig et al. ............. 257/315
2001/0023120 A1 * 9/2001 Tsunashima et al. ........ 438/585

FOREIGN PATENT DOCUMENTS

EP              637066       *  2/1995

OTHER PUBLICATIONS

IBM Tech. Discl. Bull. vol. 27, No. 12, p. 7238 (May 1985).*

* cited by examiner

Primary Examiner—Caridad Everhart
(74) Attorney, Agent, or Firm—Renner, Otto, Boisselle & Sklar, LLP

(57) ABSTRACT

The present invention relates to a process of fabricating a semiconductor device, including steps of providing a semiconductor wafer; depositing on the semiconductor wafer at least one layer comprising a high-K dielectric material layer; and subsequently removing a selected portion of the at least one layer comprising a high-K dielectric material by implanting ions into the selected portion, and removing the selected portion by etching. As a result of the implantation, the etch rate of the selected portion is increased relative to an etch rate without the implanting.

23 Claims, 3 Drawing Sheets

IMPLANTATION INTO HIGH-K DIELECTRIC MATERIAL AFTER GATE ETCH TO FACILITATE REMOVAL

TECHNICAL FIELD

The invention relates generally to the fabrication of semiconductor devices and, more particularly, to the formation of a gate stack by an integrated plasma etch of gate and gate dielectric layers. The invention further relates to integration of high-K dielectric materials into existing semiconductor fabrication processes.

BACKGROUND ART

Fabrication of a semiconductor device and an integrated circuit thereof begins with a semiconductor wafer and employs various processes, such as film formation, ion implantation, photolithography, etching and deposition techniques to form various structural features in or on a semiconductor wafer to attain individual circuit components which are then interconnected to ultimately form an integrated semiconductor circuit. Escalating requirements for high densification and performance associated with ultra large-scale integration (ULSI) semiconductor devices requires smaller design features, increased transistor and circuit speeds, high reliability and increased manufacturing throughput for competitiveness. As the devices and features shrink, and as the drive for higher performing devices escalates, new problems are discovered that require new methods of fabrication or new arrangements or both.

There is a demand for very large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is typically a thin gate dielectric material, usually referred to as a gate oxide, and a conductive gate comprising conductive polysilicon or another conductive material such as polysilicon-germanium, a silicide or a metal. In a typical integrated circuit, a plurality of MOS devices of different conductivity types, such as n-type and p-type, and complementary MOS (CMOS) devices employing both p-channel and n-channel devices are formed on a common substrate. MOS technology offers advantages of significantly reduced power density and dissipation as well as increased reliability, circuit performance and cost advantages.

The drive towards increased miniaturization and the resultant limits of conventional gate oxide layers have served as an impetus for the development of newer, high dielectric constant ("high-K") materials as substitutes for conventional silicon dioxide-based gate oxide layers. Since the drain current in a MOS device is inversely proportional to the gate oxide thickness, the gate oxide is typically made as thin as possible commensurate with the material's breakdown potential and reliability.

Decreasing the thickness of the gate oxide layer between the gate electrode and the source/drain extension regions together with the relatively high electric field across the gate oxide layer, can undesirably cause charge carriers to tunnel across the gate oxide layer. This renders the transistor "leaky", degrading its performance. To alleviate this problem, high-K dielectric materials are used as the gate dielectric. Herein, a high-K gate oxide may be referred to as a high-K gate dielectric material layer, in order to emphasize that the gate dielectric comprises a high-K dielectric material rather than silicon dioxide, which is often referred to simply as "oxide".

When integrating new materials and or processes into the fabrication of a semiconductor device, there is a strong need to do so with as little change as possible to existing facilities and equipment and to reduce the number of additional steps required by the new materials and processes. In addition, it is desirable to reduce the number of times a semiconductor wafer is handled or transferred during fabrication. As a result of new materials and/or processes, it is often necessary to address new problems presented by the new materials and/or processes which are to be integrated into existing processes, and it is sometimes possible to combine steps which would otherwise be discrete.

One problem with the addition of high-K dielectric materials to semiconductor devices arises during fabrication. In conventional devices, in which silicon dioxide is applied as a layer on a semiconductor wafer and a portion of the layer forms a gate dielectric, in most processes the portions of the layer not forming the gate dielectric can be allowed to remain on the other surfaces of the wafer. Unlike such silicon dioxide layers, when a layer of high-K dielectric material is applied as a layer and a portion of this layer is to be used as the gate dielectric, the remaining portions of the high-K dielectric material layer may be not wanted or even may be deleterious, and so should be removed from the wafer. The process steps useful for removal of such high-K dielectric material have not been fully defined. In particular, since the chemistry of the high-K dielectric materials differs from that of silicon dioxide and other "standard-K" dielectric materials, the chemistry used to remove these latter materials may not be optimal for removal of high-K dielectric materials.

Thus, a problem exists in integrating high-K dielectric materials into a fabricating process, specifically the problem of removing high-K dielectric material from selected areas of a semiconductor wafer. As a result, a process is needed for removing high-K dielectric materials from selected areas of a semiconductor wafer, in which the high-K dielectric material may be removed as simply as possible, while introducing a minimum number of additional steps into the fabrication process.

DISCLOSURE OF INVENTION

In one embodiment, the present invention relates to a process of fabricating a semiconductor device, including steps of providing a semiconductor wafer; depositing on the semiconductor wafer at least one layer comprising a high-K dielectric material layer, and subsequently removing a selected portion of the at least one layer comprising a high-K dielectric material by implanting ions into the selected portion, and removing the selected portion by etching, in which the implanted ions increase an etch rate relative to an etch rate without the implanting.

In another embodiment, the present invention relates to a process of fabricating a semiconductor device, including steps of providing a semiconductor wafer; depositing on the semiconductor wafer at least one layer comprising a high-K dielectric material; depositing on the at least one layer comprising a high-K dielectric material a layer comprising polysilicon or polysilicon-germanium; removing portions of the layer comprising polysilicon or polysilicon-germanium; and removing a selected portion of the at least one layer comprising a high-K dielectric material by implanting ions into the selected portion, and removing the selected portion by etching, in which the implanted ions increase an etch rate relative to an etch rate without the implanting.

In another embodiment, the present invention relates to a process of fabricating a semiconductor device, including steps of providing a semiconductor wafer; depositing on the semiconductor wafer at least one layer comprising a high-K dielectric material layer; depositing on the at least one layer comprising a high-K dielectric material at least one gate layer; forming a gate electrode by removing portions of the at least one gate layer; and removing a selected portion of the at least one layer comprising a high-K dielectric material by implanting ions into the selected portion, and removing the selected portion by plasma etching, in which the implanted ions increase an etch rate of the selected portion relative to an etch rate without the implanting.

Thus, the present invention provides a method for etching a selected portion of a layer comprising a high-K dielectric material, thus simplifying and facilitating removal of the selected portion of the high-K dielectric material. The present invention provides a solution to the problem of removing high-K dielectric material from areas of a semiconductor wafer, by enabling use of an etch process similar to known etching processes for removing other dielectric materials. The present invention thus provides a process that fabricates a device having improved performance by allowing incorporation of a high-K dielectric material, while minimizing additional processing steps associated with incorporation of the high-K dielectric material.

Figure 1:
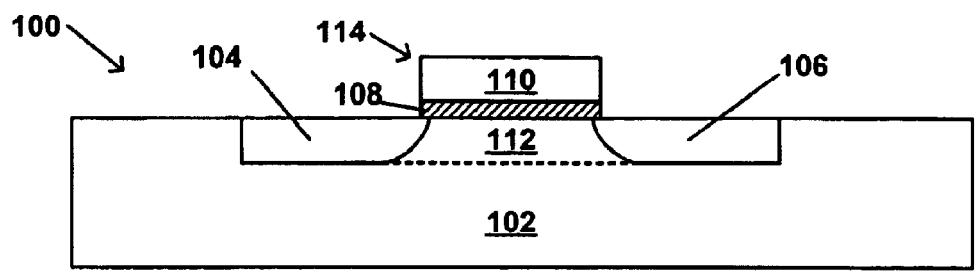
FIG. 1 is a schematic cross-sectional view of an exemplary MOS structure in accordance with the present invention.

It should be appreciated that for simplicity and clarity of illustration, elements shown in the figures have not necessarily been drawn to scale. For example, some dimensions of some of the elements may be exaggerated relative to each other for clarity.

Further, where considered appropriate, reference numerals have been repeated among the figures to indicate corresponding or same elements.

MODES FOR CARRYING OUT THE INVENTION

As used herein, the term "standard-K dielectric material" refers to a dielectric material having a dielectric constant, K, up to about 10. Such standard-K dielectric materials include, for example, silicon dioxide, having a K of about 4, silicon oxynitride, having a K of about 4–8 depending on the relative content of oxygen and nitrogen, silicon nitride, having a K of about 6–9, and aluminum oxide, having a K of about 10.

As used herein, the term "high-K dielectric material" refers to a dielectric material having a dielectric constant, K, greater than about 10. Such high-K dielectric materials include, for example, $HfO_2$, $ZrO_2$ and others known in the art, some of which are specifically identified more fully below. In general, the term "high-K dielectric material" encompasses binary, ternary and higher oxides and any ferroelectric material having a K of about 10 or more. High-K dielectric materials may also include, for example, composite materials such as hafnium silicate, having a K of about 14, hafnium silicon oxynitride, having a K of about 16, depending on the relative content of oxygen and nitrogen, and hafnium silicon nitride, having a K of about 18.

As used herein, the term "composite dielectric material" refers to a dielectric material comprising the elements of at least two other dielectric materials. In one embodiment, a composite dielectric material has a K value as defined above for a high-K dielectric material. A composite dielectric material may be formed by co-deposition of its component elements, or by sequential deposition followed by a treatment step, e.g., thermal treatment, to combine the component elements to form the composite dielectric material. Exemplary composite dielectric materials include hafnium silicate, zirconium silicate, hafnium silicon oxynitride, zirconium silicon nitride, hafnium or zirconium aluminate, combinations of two or more high-K dielectric materials, and combinations of other high-K dielectric materials with standard-K dielectric materials.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Using a high-K dielectric material for the gate dielectric layer provides a layer having a low electrical thickness in a physically thick layer. For example, a high-K gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness of a layer of silicon dioxide. Thus, a high-K dielectric material layer having a K value of 40 and a given physical thickness has an equivalent oxide thickness which is approximately $\frac{1}{10}$ the given physical thickness. For higher-K dielectric materials, even thicker gate dielectric material layers can be formed while maintaining equivalent oxide thickness values lower than are practically possible with very thin silicon dioxide layers. In this way, the reliability problems associated with very thin dielectric layers may be avoided while transistor performance is increased.

Approximate K-values or, in some cases, a range of K-values, are shown below in Table 1 for some exemplary dielectric materials. It is understood that the present invention is not limited to the specific dielectric materials disclosed herein, but may include any appropriate standard-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
| --- | --- |
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| hafnium aluminate | 12–20 |
| lanthanum oxide, $La_2O_3$ | 20–30 |
| hafnium oxide, $HfO_2$ | 20 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST ($Ba_{1-x}Sr_xTiO_3$) | ~20—200 |
| $PbTiO_3$ | ~20—200 |
| $BaTiO_3$ | ~20—200 |
| $SrTiO_3$ | ~20—200 |
| $PbZrO_3$ | ~20—200 |
| PST ($PbSc_xTa_{1-x}O_3$) | ~20—3000 |
| PZN ($PbZn_xNb_{1-x}O_3$) | ~200—5000 |
| PZT ($PbZr_xTi_{1-x}O_3$) | ~100—1000 |
| PMN ($PbMg_xNb_{1-x}O_3$) | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of ordinary skill in the art, such variations may occur naturally, or may be sought and controlled by selection and control of the conditions under which materials are formed.

Here and in all numerical values in the specification and claims, the limits of the ranges and ratios may be combined.

Semiconductor Devices

The present invention is described hereinbelow in terms of a common semiconductor device, specifically, a metal oxide semiconductor field effect transistor (MOSFET) formed on a silicon substrate. An embodiment of the present invention in a MOSFET is shown in FIG. 1. The present invention is not limited to this illustrative embodiment, however, and may be applied to any semiconductor device in which a high-K dielectric material may be used, for example, in a high-K gate dielectric in a FET, in a floating metal gate electrode EEPROM flash memory device, or in a SONOS-type flash memory device, such as the Mirror-Bit™ SONOS-type flash memory device available from Advanced Micro Devices, Sunnyvale, Calif. The invention is generally applicable to the fabrication of any device including a layer comprising a high-K dielectric material in which a portion of the layer comprising a high-K dielectric material is to be removed. Thus, it is to be understood that the present invention is not limited to the specific illustrative embodiments described below.

In one embodiment, the present invention relates to a process of making the semiconductor device, in which the semiconductor device may include, for example, a semiconductor substrate, a polysilicon or polysilicon-germanium gate electrode layer and a high-K gate dielectric material layer separating the polysilicon or polysilicon-germanium gate electrode from the semiconductor device surface.

FIG. 1 is a schematic cross-sectional view of a MOSFET 100. The MOSFET 100 includes, for example, a p-doped silicon substrate 102, an n-doped source region 104, an n-doped drain region 106, a high-K gate dielectric material layer 108, a gate electrode 110, and a channel region 112. The high-K gate dielectric layer 108 and the gate electrode layer 110 form a gate stack 114.

Not shown in FIG. 1 are additional parts of a working semiconductor device, such as electrical conductors, interlayer dielectric layer, contacts and other parts of the structure which typically would be included in a complete, working semiconductor device. These additional parts are not necessary to the present invention, and for simplicity and brevity are neither shown nor described, but could be easily added as will be understood by those of ordinary skill in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art.

The present invention is not limited to any particular type of semiconductor substrate.

The present invention is described, in some embodiments, in terms of a polysilicon or polysilicon-germanium gate electrode layer deposited over a high-K gate dielectric material layer, and subsequent etching of these layers to form a gate stack including a gate electrode and a gate dielectric. The invention is not limited to such embodiments, but may be applied to removing portions of a layer comprising a high-K dielectric material in other device structures.

Processes for Fabricating a Semiconductor Device

The present invention further relates to a process of fabricating a semiconductor device including a high-K dielectric material, and to a process for integrating a high-K containing semiconductor wafer or device into a fabrication process in which at least a portion of a layer comprising a high-K dielectric material is to be removed.

Details of an exemplary process in accordance with the present invention are set forth below. The specific examples provided herein are intended to explain the invention, but are not intended to limit the scope of the invention, which is defined by the attached claims. In the first step of the process of the present invention, shown in FIG. 10 as Step S1001, a semiconductor wafer 102 is provided, as shown in, e.g., FIG. 2. The semiconductor wafer 102 may be any appropriately selected semiconductor substrate known in the art, as described above.

Figure 2:
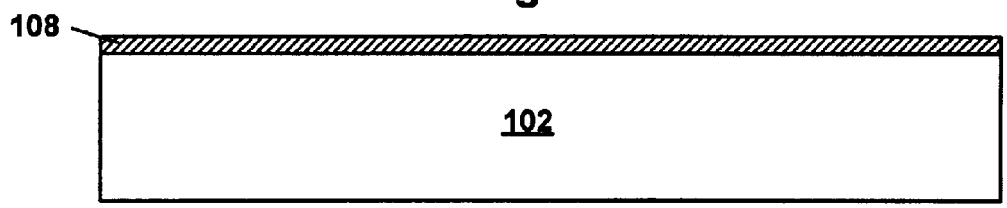
FIG. 2 is a schematic cross-sectional view of a semiconductor wafer with a layer comprising a high-K gate dielectric material applied thereon.
Figure 10:
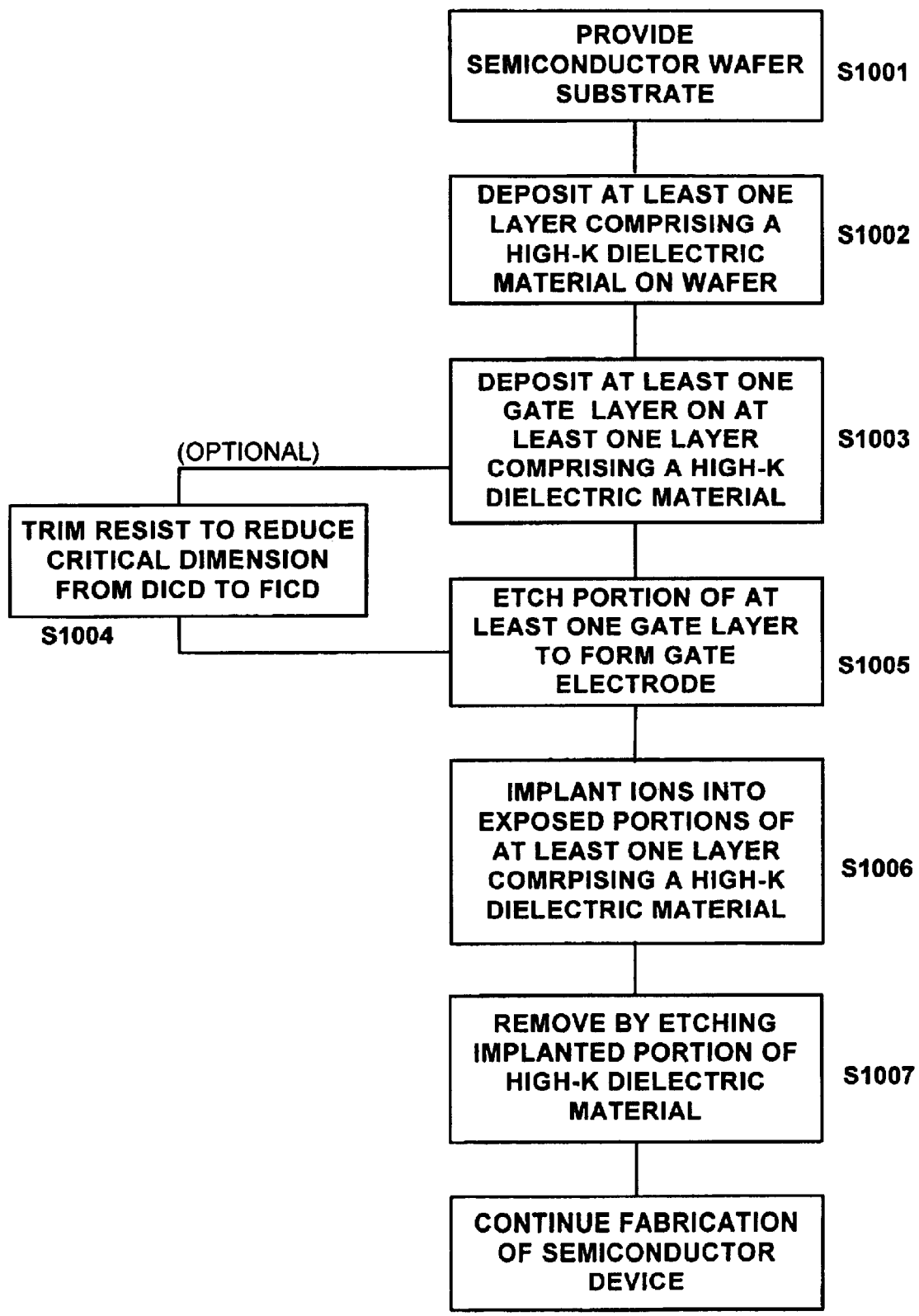
FIG. 10 is a schematic flow diagram showing steps in a process of fabricating a semiconductor device, in accordance with the present invention.

In the second step of the process of the present invention, shown in FIG. 10 as Step S1002, at least one layer 108 comprising at least one high-K gate dielectric material is deposited on the surface of the semiconductor wafer 102. FIG. 2 shows the nascent semiconductor device 100 after deposition of a layer 108 comprising a high-K gate dielectric material, i.e., at the completion of step S1002.

The layer 108 comprising a high-K dielectric material may be deposited by any appropriate method known in the art. In one embodiment, the layer 108 comprising a high-K dielectric material is deposited by a suitable CVD process. For example, the high-K dielectric material may be deposited by LPCVD, RTCVD, MOCVD or ALCVD. In addition, the high-K dielectric material may be deposited by PVD or sputtering.

The high-K gate dielectric material layer 108 may include any high-K material which is appropriate for use with the particular semiconductor device of interest in the fabrication process. The high-K gate dielectric material layer 108 may comprise, for example, any one of a variety of known high-K dielectric materials, such as those listed above or those described in detail in the following. Such materials may include, for example, hafnium oxide, yttrium oxide, lanthanum oxide, and composites and combinations of such high-K dielectric materials with standard-K dielectric materials (e.g., $SiO_2$), such as hafnium silicate, $HfSiO_4$. Such composites have been defined herein as composite dielectric materials. Suitable exemplary high-K dielectric materials include those disclosed in the above table and associated disclosure.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O12$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In another embodiment, the high-K dielectric material includes at least one of silicates of one or more of $ZrO_2$, $HfO_2$, $Al_2O_3$, $Y_2O_3$, $CeO_2$ and $La_2O_3$ or aluminates of one or more of $ZrO_2$, $HfO_2$, $Y_2O_3$, $CeO_2$ and $La_2O_3$. Combinations of the foregoing high-K and composite dielectric materials may also be used. In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 10 or higher, also may be used in the present invention.

In one embodiment, the high-K material is a high-K material other than tantalum oxide ($Ta_2O_5$). Tantalum oxide has been found, in some embodiments, to exhibit an undesirably high leakage current.

In one embodiment, the high-K dielectric material has a K value in the range from about 10 to about 5000. In another embodiment, the high-K dielectric material has a K value in the range from about 10 to about 200, and in yet another embodiment, the K value is from about 15 to about 50.

Although only a single layer 108 comprising a high-K gate dielectric material is shown in FIG. 2, it is understood that multiple layers or sub-layers may be included in the layer 108. In addition to multiple layers comprising one or more high-K dielectric materials, one or more layers comprising a standard-K dielectric material may be deposited or formed adjacent to the at least one layer 108 comprising a high-K dielectric material. For example, in one embodiment, a there-layer stack may be formed, including a first layer comprising a high-K dielectric material, a second layer comprising a standard-K dielectric material, and a third layer comprising a high-K dielectric material. The two high-k dielectric materials maybe the same or different dielectric material. In another embodiment, a three-layer stack may be formed, including a first layer comprising a standard-K dielectric material, a second layer comprising a high-K dielectric material, and a third layer comprising a standard-K dielectric material. The two standard-K dielectric materials maybe the same or different dielectric material. Other such combinations may be deposited, for example, two layers each comprising a same or different high-K dielectric material. Thus, although the dielectric layer 108 is sometimes referred to herein as the "layer 108 comprising a high-K dielectric material", it is to be understood that this designation includes the foregoing alternative embodiments, and may for include other equivalent embodiments.

Thus, in one embodiment, the layer comprising a high-K dielectric material may further include a second layer including a dielectric material. The dielectric material in the second layer may be one or more of a standard-K dielectric material, a composite dielectric material, or a second high-K dielectric material. In another embodiment, the layer comprising a high-K dielectric material may further include additional layers of dielectric material.

It is recognized that, in an embodiment in which the layer 108 comprising a high-K dielectric material includes a standard-K dielectric material as the uppermost layer, the standard-K dielectric material layer may be removed by any appropriate means, including that disclosed herein for removal of the high-K dielectric material, or by other, known means.

Figure 3:
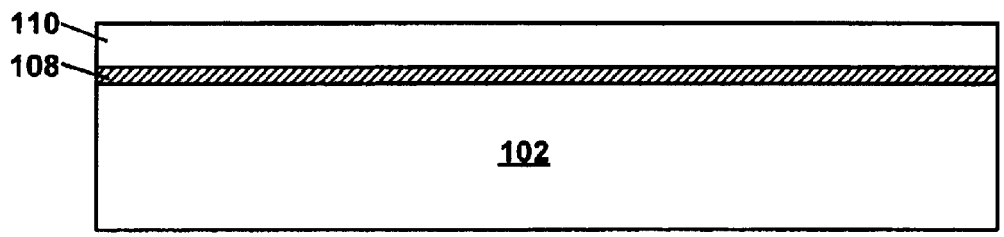
FIG. 3 is a schematic cross-sectional view of a semiconductor wafer with a gate layer deposited on the layer comprising a high-K dielectric material of FIG. 2.

In the third step of the process of the present invention, shown in FIG. 10 as Step S1003, a gate layer 110 is deposited on the layer 108 comprising a high-K dielectric material. In one embodiment, the gate layer 110 comprises polysilicon or polysilicon-germanium. FIG. 3 shows the nascent semiconductor device 100 after deposition of the gate layer 110 on the layer 108 comprising a high-K dielectric material, i.e., at the completion of step S1003.

The gate layer 110 is deposited by applying a layer 110 of, e.g., polysilicon or polysilicon-germanium, or another suitable gate electrode material, by any suitable method known in the art, over the surface of the layer 108 comprising a high-K dielectric material.

In one embodiment the step of depositing a gate layer is carried out by CVD. In one such embodiment, the CVD process may be LPCVD, RTCVD, MOCVD or ALCVD. In one embodiment, the step of depositing a gate layer is carried out by a non-plasma CVD process. Non-plasma CVD processes may be preferred since these methods may provide more control to the deposition process, and avoid deposition of impurities along with the material of which the gate layer 110 is formed.

In an embodiment using CVD deposition, the CVD process may be carried out in suitable CVD apparatus, as known in the art. For example, the RTCVD, MOCVD or ALCVD processes may be carried out in a single-wafer cluster tool.

Although only a single gate layer 110 is shown in FIG. 3, it is understood that multiple layers may be included in the gate layer 110. In one exemplary embodiment, the multiple gate layers comprise two or more alternating layers of, e.g., polysilicon and polysilicon-germanium. In another exemplary embodiment, the multiple gate layers comprise one or more layers of polysilicon and/or polysilicon-germanium, with a metal layer or a silicide layer placed adjacent or between layers of polysilicon and/or polysilicon-germanium. In another exemplary embodiment, a metal layer or a silicide layer may be deposited above or below a single layer of polysilicon or polysilicon-germanium. Finally, as will be recognized, the silicide layer may be formed by initially depositing a polysilicon or polysilicon-germanium layer adjacent to and in contact with a suitable metal (i.e., a metal capable of forming a desired metal silicide), followed by appropriate treatment (e.g., thermal treatment) to form the corresponding metal silicide. Thus, although the gate layer 110 is sometimes referred to herein as the "polysilicon or polysilicon-germanium gate layer 110" or as "the gate layer 110", it is to be understood that this designation includes the foregoing alternative embodiments, and may further include other equivalent embodiments. The polysilicon or polysilicon-germanium gate layer is an exemplary, sometimes preferred, embodiment of the gate layer 110.

As discussed in more detail below and as shown in FIG. 10, the process of the present invention may proceed directly from step S1003 to step S1005, or step S1004 may be carried out subsequent to the step S1003 and prior to the step S1005.

Step S1004, described below, includes an optional resist trim step, as shown in FIG. 10. As is known in the art, final critical dimensions, also referred to as "Final Inspect Critical Dimension" or "FICD," may be less than the smallest critical dimensions which can be obtained by photolithography, which may be referred to as "Develop Inspect Critical Dimension," or "DICD." In one embodiment, the problem of obtaining a FICD smaller than the DICD is overcome by subjecting the photolithographically patterned resist to a resist trim, in which the critical dimensions of the patterned resist are reduced from the DICD to the FICD. The resist trim step S1004 is described below in more detail. Although it is an optional step, it is recognized that the step S1004 may be routinely carried out in order to obtain a desired FICD of the gate stack. The resist trim step is not essential to the present invention and so is indicated as an optional step. The present invention is applicable to formation of a gate stack, including a gate electrode and a gate dielectric, of any dimension.

Figure 5:
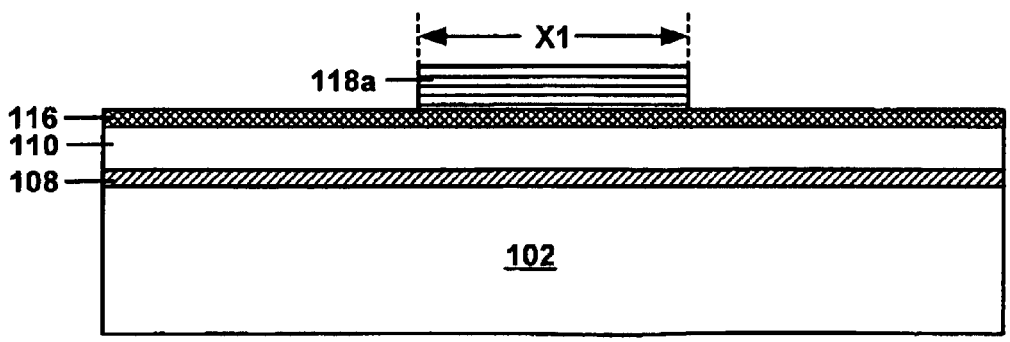
FIG. 5 is a schematic cross-sectional view of a semiconductor wafer in which the photoresist layer has been subjected to photolithography to form a desired pattern.
Figure 6:
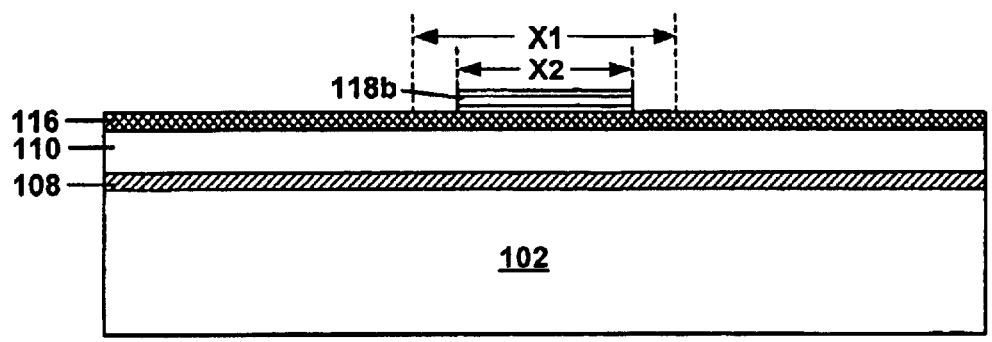
FIG. 6 is a schematic cross-sectional view of a semiconductor wafer in which the photoresist layer has been subjected to a resist trim to reduce the critical dimension of the desired pattern.

Step S1005, described below, includes formation of a gate electrode 110 from the polysilicon or polysilicon-germanium gate layer 110. Following deposition of the polysilicon or polysilicon-germanium gate layer 110, the polysilicon or polysilicon-germanium gate layer 110 is etched to form the polysilicon or polysilicon-germanium gate electrode 110, as shown, e.g., in FIG. 7. As described in more detail below, in one embodiment, when the size of the gate electrode is to be made smaller than a DICD, the step S1005, in which the gate layer 110 is etched, may be preceded by the optional resist trim step S1004. The resist trim step S1004 is illustrated in FIGS. 5 and 6.

Figure 4:
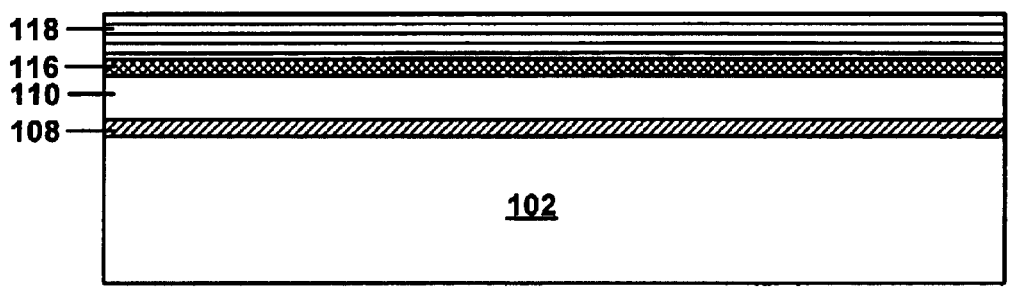
FIG. 4 is a schematic cross-sectional view of a semiconductor wafer with BARC and photoresist layers formed on the gate layer of FIG. 3.

In preparation for the step S1005, in one embodiment, a bottom anti-reflective coating (BARC) and a photoresist layer may be formed on the polysilicon or polysilicon-germanium gate layer 110 prior to the etching step, in order to define the area to be etched, as known in the art. FIG. 4 is a schematic cross-sectional view of a semiconductor wafer 102 with a BARC 116 and a photoresist layer 118 formed on the polysilicon or polysilicon-germanium gate layer 110 of FIG. 3. In one embodiment, the BARC 116 may be, for example, silicon-rich silicon nitride, in another embodiment, the BARC 116 may be silicon oxynitride and in other embodiments, other materials known in the art for use as a BARC. In one embodiment, the BARC may have a thickness, for example, in the range from about 200 Angstroms (Å) to about 400 Å.

In one embodiment, the resist material 118 may be, for example, 248 nm DUV resist or, in another embodiment, a 193 nm resist. In one embodiment, the resist material 118 may be spun on, to a thickness, for example, in the range from about 5000 Å to about 7000 Å.

Following deposition of the BARC 116 and the resist layer 118, a desired pattern is formed in the resist layer 119 by a suitable lithography process. FIG. 5 is a schematic cross-sectional view of the semiconductor wafer in which a desired pattern 118a has been formed in the resist layer 118 by photolithography. The pattern 118a has the DICD at this stage, indicated as dimension X1 in FIG. 5. At this point, the process of the present invention may proceed directly to step S1005, or step S1004 may be carried out next, followed by step S1005.

In an embodiment in which the pattern 118a has a DICD, and a smaller FICD is needed, the pattern 118a may be subjected to the resist trim step S1004 to reduce the DICD to the FICD. The resist trim step S1004 may be carried out by any appropriate method known in the art Thus, for example, the resist trim step may be carried out by a wet chemical etch or by a plasma etch of the developed, patterned resist 118a. In one embodiment, the resist trim step S1004 is carried out according to the method described in U.S. Pat. No. 6,121,155, assigned to the assignee of the present application.

The method disclosed in U.S. Pat. No. 6,121,155, may be summarized as follows. Following patterning of photoresist mask features, the mask features are trimmed using a high density plasma etch method. The method includes the steps of: (a) establishing an HBr gas flow rate in a plasma chamber of the system in a range from about 50 standard cubic centimeters per minute (sccm) to about 100 sccm; (b) establishing an $O_2$ flow rate in the plasma system chamber in a range from about 5 sccm to about 15 sccm; (c) providing a plasma chamber temperature in a range from about 50° to 75° C.; (d) providing pressure in the plasma system chamber in a range from about 3 milliTorr (mT) to about 10 mT; (e) operating plasma generating source power in a range from about 500 Watts (W) to about 1000 W; and (f) operating wafer bias power in a range from about 25 W to about 125 W. As a result of the foregoing process steps, component features may be obtained which are smaller (i.e., the FICD) than features which can be obtained by known photolithographic printing methods (i.e., the DICD).

In one embodiment, the foregoing etch trim method according to U.S. Pat. No. 6,121,155 is exemplary, and in other embodiments, any appropriate method known in the art may be used for the etch trim step S1004. The resist trim step S1004 reduces the size of the resist pattern 118a to the size of the resist pattern 118b, as shown in FIG. 6.

FIG. 6 is a schematic cross-sectional view of a semiconductor wafer 102 following step S1004. As shown in FIG. 6, the resist pattern 118a of the photoresist layer 118 has been subjected to a resist trim to reduce the critical dimension of the desired resist pattern from the DICD dimension X1 shown in FIG. 5 to the FICD, shown as a reduced desired pattern 118b in FIG. 6. As shown in FIG. 6, the reduced desired pattern 118b has the FICD, indicated as X2. As shown in FIG. 6, the reduced desired pattern 118b is reduced in both width and height as compared to the desired pattern 118a shown in FIG. 5. Dashed lines in FIG. 6 indicate the both the dimension X1 and the dimension X2, for comparison. The remainder of the subsequent etches substantially maintain the dimension X2, in forming the gate stack 114. Thus, the approximate dimensions of the gate stack 114 are substantially determined at this time. Following the resist trim, the process moves on to the steps in which the gate layer 110 is etched.

Following the step S1004, if any, the gate etch step S1005 is carried out. As shown in FIG. 10, step S1005 includes an etch step to form the gate electrode 110. In one embodiment, the etching step S1005 may comprise any etching method known in the art for etching a gate layer to form a gate electrode therefrom.

The step S1005, the etching to form the gate electrode 110, may be carried out by any appropriate etching methods known in the art. In one embodiment, the etching is a wet chemical etch. In another embodiment, the polysilicon or polysilicon-germanium etching is a plasma etch. The etching chemistry may be appropriately selected based on the materials of which the gate layer 110 is formed, e.g., polysilicon or polysilicon-germanium, other materials or combinations thereof.

In one embodiment following any resist trim etching step S1004, the step S1005 is carried out by conventional wet chemical etching, for example, using a dilute aqueous solution of HF, or an aqueous solution of sulfuric acid.

In one embodiment, following any resist trim etching step S1004, the step S1005 is carried out by plasma etching polysilicon or polysilicon-germanium, using conventional etching chemistry. In one embodiment, the step of plasma etching the polysilicon or polysilicon-germanium gate layer comprises a $HBr/Cl_2/HeO_2$ plasma chemistry. In one embodiment, the step S1005 is carried out with a mixture of gases further comprising a fluorine-containing material. In one embodiment, the fluorine containing material is one or more of $CF_4$, $C_2F_6$, $CHF_3$, $C_2HF_5$, $CH_2F_2$, $C_2H_2F_4$, and $XeF_2$. Other known fluorine-containing materials may be used.

Figure 7:
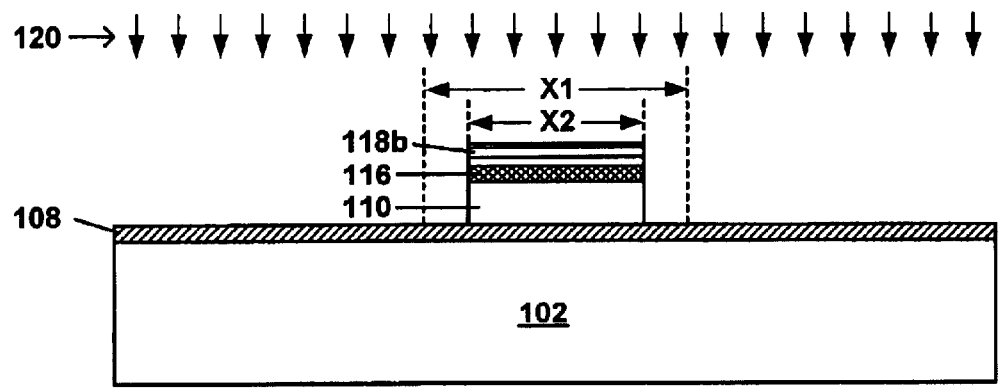
FIG. 7 is a schematic cross-sectional view of a semiconductor wafer following removal of portions of the gate layer, in which the etch stop layer is the layer comprising a high-K dielectric material, and schematically showing an implantation into portions of the layer comprising a high-K dielectric material, in accordance with an embodiment of the present invention.

FIG. 7 is a schematic cross-sectional view of the semiconductor wafer following removal of portions of the polysilicon or polysilicon-germanium gate layer 110, at the completion of step S1005. As shown in FIG. 7, the gate etching stops at the layer 108 comprising a high-K dielectric material, and does not remove the high-K dielectric material, thus, the layer 108 acts as an etch stop layer in step S1005. As shown in FIG. 7, the gate layer 110 has the FICD dimension X2 following the gate etch.

In the sixth step of the process of the present invention, shown in FIG. 10 as step S1006, ions are implanted into the layer 108 comprising a high-K dielectric material. In the implantation step S1006, the remaining gate layer 110, forming the gate electrode in this exemplary embodiment, the BARC 116 and the resist 118b act as a mask for the implantation. These layers prevent implantation into the portion of the layer 108 comprising a high-K dielectric material which is designated to form the gate dielectric. As would be understood by those of ordinary skill in the art, if other portions of the layer 108 comprising a high-K dielectric material are intended to be retained, such portions may also be protected by a suitably applied mask. The ion implantation step S1006 may be carried out by any appropriate implantation device and method known in the art. FIG. 7 is a schematic cross-sectional view of a semiconductor wafer schematically showing the implantation of ions, in which the ions to be implanted are represented by arrows 120.

In one embodiment, the implantation step S1006 implants one or more of helium, neon, argon, xenon, silicon, germanium, nitrogen, oxygen, fluorine, chlorine, bromine or iodine, into the layer 108 comprising a high-K dielectric material. While not to be bound by theory, implantation of these ions is considered to cause damage to the structure of the layer 108 comprising a high-K dielectric material and/or to increase the reactivity of the high-K dielectric material. In addition, implantation of silicon and germanium may result in the formation of silicates or germanates of high-K dielectric materials such as hafnium oxide, zirconium oxide, cerium oxide, and other similar high-K metal oxides. Such silicates and germanates are expected to be more easily etchable than the original high-K dielectric materials from which the silicate or germanate is formed. Similarly, implantation of the halogens may result in the formation of compounds which are expected to be more easily etchable than the original high-K dielectric material. These results of the implantation are considered to increase the susceptibility of the layer 108 comprising a high-K dielectric material to subsequently applied etching steps used to remove the high-K dielectric material from the selected, implanted locations on the semiconductor wafer 100.

In the implantation, the polysilicon or polysilicon-germanium gate 110 and the overlying mask and BARC layers, act as a self-aligning mask for the implantation, so that implanted ions are implanted only in exposed portions of the layer 108 comprising a high-K dielectric material which is intended to be removed subsequently.

Figure 8:
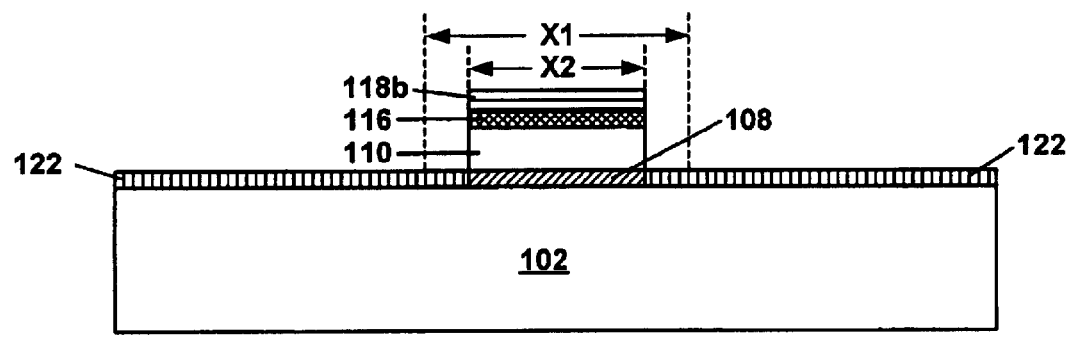
FIG. 8 is a schematic cross-sectional view of a semiconductor wafer following implantation of ions into exposed portions of the layer comprising a high-K dielectric material, in accordance with the present invention.

FIG. 8 is a schematic cross-sectional view of a semiconductor wafer 100 following implantation of ions into the exposed portions of the layer 108 comprising a high-K dielectric material, which has been transformed by the implantation into a damaged high-K dielectric material layer 122. The term "damaged" is used to indicate that the implanted ions have caused changes in the layer comprising a high-K dielectric material which will increase the susceptibility of the implanted layer comprising a high-K dielectric material to subsequently applied etching steps used to remove the high-K dielectric material from the selected, implanted locations on the semiconductor wafer 100. The changes caused may be physical, chemical, electronic or any combination of these, or may be other effects. The net result of the implantation, in accordance with the present invention, is that the damaged high-K dielectric material is etched more easily and quickly (i.e., at a higher rate) than it would have been in the absence of the implantation treatment. As such the implanted ions increase the etch rate (in a subsequent etch) of the high-K dielectric material relative to an etch rate which would have been obtained without the implanting step. As shown in FIG. 8, the portion of the layer 108 comprising a high-K dielectric material below the gate electrode 110 is not damaged, and so retains the reference numeral 108, indicating it is the high-K dielectric material, in substantially the same condition as when this material was originally deposited.

In the seventh step of the process of the present invention, shown in FIG. 10 as step S1007, the damaged high-K dielectric material layer 122 is removed. In one embodiment, the damaged high-K dielectric material layer 122 is removed by being etched as described below. As shown in FIG. 10, step S1007 includes an etch step to remove the damaged high-K dielectric material layer 122, thereby to form the gate dielectric 110.

The step S1007, in which the damaged high-K dielectric material layer 122 is detached to leave the gate dielectric 108, may be carried out by any appropriate etching method known in the art. In one embodiment, the damaged high-K dielectric material layer is etched by a wet chemical etch. In another embodiment, the damaged high-K dielectric material layer is etched by a plasma etch.

In one embodiment, the step S1007 is carried out by a conventional wet chemical etch, for example, using an aqueous solution of HF, or an aqueous solution of sulfuric acid. It is expected that employment of the method of the present invention will allow use of a wider range of conventional wet etches for the removal of high-K dielectric materials than would be available without the implantation.

In one embodiment, the step S1007 is carried out by a plasma etch of the damaged high-K dielectric material layer 122, using conventional plasma etch chemistry. In one embodiment, the step of plasma etching the polysilicon or polysilicon-germanium layer comprises a $HBr/Cl_2/HeO_2$ chemistry. In one embodiment, the step S1007 is carried out with a mixture of gases further comprising a fluorine-containing material. In one embodiment, the fluorine containing material is one or more of $CF_4$, $C_2F6$, $CHF_3$, $C_2HF_5$, $CH_2F_2$, $C_2H_2F4$, and $XeF_2$. Other known fluorine-containing materials may be used.

Following the plasma etching, remaining portions of the BARC 116 and the resist 118b may be removed, using appropriate methods known to those of ordinary skill in the art.

Figure 9:
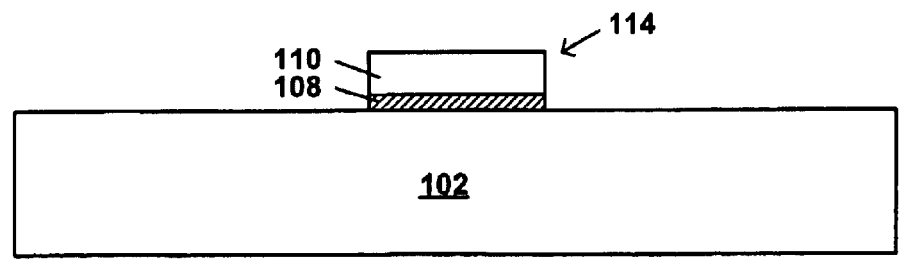
FIG. 9 is a schematic cross-sectional view of a semiconductor wafer following removal of the implanted portions of the layer comprising a high-K dielectric material to form a gate stack, in accordance with the present invention.

FIG. 9 is a schematic cross-sectional view of a semiconductor wafer 100 following the step of etching the damaged high-K dielectric material layer 122, and removal of the BARC 116 and the resist 118b. As a result of these steps, the gate stack 114 is formed. As shown in FIG. 9, following the gate etching step S1005, the implantation step S1006 and the high-K dielectric material etching step S1007, the gate stack 114 includes a gate layer 110 and a high-K gate dielectric material layer 108 as parts of the nascent semiconductor device 100.

As will be recognized by those of skill in the art, the times and etching conditions of both step S1005 and step S1007 may be adjusted as needed, depending on the quantities of the gate layer material, quantities of high-K dielectric material to be removed, the specific identity of the respective materials to be removed, the etching methods chosen for use, and other economic and process-related factors.

Following completion of step S1007, the fabrication process of the semiconductor device 100 may be continued, as shown in FIG. 10.

Upon completion of formation of the gate stack 114, and further processing including, for example, formation of the source and drain 104, 106, the semiconductor device 100 shown in FIG. 1 is obtained. The source and drain 104, 106 may be formed at an appropriate time by any suitable method, such as by a self-aligned implantation. Thereafter, the semiconductor device 100 may be further processed as appropriate to the fabrication scheme of which the process of the present invention is a part.

INDUSTRIAL APPLICABILITY

As a result of the process of the present invention, a process is provided for removing high-K dielectric materials from selected areas of a semiconductor wafer, in which the high-K dielectric material may be removed by a relatively simple process, while introducing a minimum number of additional steps into the fabrication process. Specifically, by adding a step of implantation of ions into a selected portion of a layer comprising a high-K dielectric material to be removed, the removal of high-K dielectric material is facilitated, relative to the removal without such treatment. Thus, high-K dielectric material-containing semiconductor wafers can be fabricated in an existing process with minimal change, while still allowing for removal of selected portions of the high-K dielectric material layer.

While the invention has been described in conjunction with specific embodiments herein, it is evident that many alternatives, modifications and variations will be apparent to those skilled in the art in light of the foregoing description. Accordingly it is intended to embrace all such alternatives and modifications in variations as for within the spirit and broad scope of the appended claims.

What is claimed is:

1. A process of fabricating a semiconductor device, comprising:

providing a semiconductor wafer;

depositing on the semiconductor wafer at least one layer comprising a high-K dielectric material layer; and subsequently removing a selected portion of the at least one layer comprising a high-K dielectric material by:

implanting ions into the selected portion, and removing the selected portion by etching, wherein the implanted ions increase an etch rate relative to an etch rate without the implanting, further comprising forming a gate layer on the layer comprising a high-K dielectric material.

2. The process of claim 1, wherein the step of removing the implanted portion by etching is carried out by wet chemical etching or by plasma etching.

3. The process of claim 2, wherein the wet chemical etching comprises applying HF as an etchant.

4. The process of claim 1, wherein the implant ions comprise helium, neon, argon, xenon, silicon, germanium, fluorine, chlorine, bromine, iodine or a mixture of two or more thereof.

5. The process of claim 1, wherein the gate layer comprises a polysilicon or polysilicon-germanium layer.

6. The process of claim 1, further comprising etching a portion of the gate layer to form a gate electrode.

7. The process of claim 6, wherein the etching a portion of the gate layer is by plasma etching.

8. The process of claim 7, wherein the plasma etching comprises providing a $HBr/Cl_2/HeO_2$ chemistry to a plasma etch chamber.

9. The process of claim 7, wherein the plasma etching further comprises providing a fluorine-containing material to the plasma etch chamber.

10. The process of claim 1, wherein the at least one layer comprising a high-K dielectric material further comprises at least one additional layer comprising a dielectric material, wherein the at least one additional layer comprising a dielectric material comprises at least one of a standard-K dielectric material, a composite dielectric material, or a second high-K dielectric material.

11. A process of fabricating a semiconductor device, comprising:
   providing a semiconductor wafer;
   depositing on the semiconductor wafer at least one layer comprising a high-K dielectric material layer; and
   subsequently removing a selected portion of the at least one layer comprising a high-K dielectric material by:
   implanting ions into the selected portion, and
   removing the selected portion by plasma etching
   wherein the implanted ions increase an etch rate relative to an etch rate without the implanting,
   wherein the plasma etching comprises providing a $HBr/Cl_2HeO_2$ chemistry to a plasma etch chamber.

12. The process of claim 11, wherein the plasma etching further comprises providing a fluorine-containing material to the plasma etch chamber.

13. A process of fabricating a semiconductor device, comprising:
   providing a semiconductor wafer;
   depositing on the semiconductor wafer at least one layer comprising a high-K dielectric material;
   depositing on the at least one layer comprising a high-K dielectric material at least one layer comprising polysilicon or polysilicon-germanium;
   removing portions of the layer comprising polysilicon or polysilicon-germanium; and
   removing a selected portion of the at least one layer comprising a high-K dielectric material by:
   implanting ions into the selected portion, and
   removing the selected portion by etching,
   wherein the implanted ions increase an etch rate relative to an etch rate without the implanting.

14. The process of claim 13, wherein the step of removing the implanted portion by etching is carried out by wet chemical etching or by plasma etching.

15. The process of claim 14, wherein the wet chemical etching comprises applying HF as an etchant.

16. The process of claim 13, wherein the plasma etching comprises providing a $HBr/Cl_2HeO_2$ chemistry to a plasma etch chamber.

17. The process of claim 16, wherein the plasma etching further comprises providing a fluorine-containing material to the plasma etch chamber.

18. The process of claim 13, wherein the implanted ions comprise helium, neon argon, xenon, silicon, germanium, fluorine, chlorine, bromine, iodine or a mixture of two or more thereof.

19. A process of fabricating a semiconductor device, comprising:
   providing a semiconductor wafer;
   depositing on the semiconductor wafer at least one layer comprising a high-K dielectric material layer;
   depositing on the at least one layer comprising a high-K dielectric material at least one gate layer;
   forming a gate electrode by removing portions of the at least one gate layer by plasma etching; and
   removing a selected portion of the at least one layer comprising a high-K dielectric material by:
   implanting ions into the selected portion, and
   removing the selected portion by plasma etching,
   wherein the implanted ions increase an etch rate of the selected portion relative to an etch rate without the implanting.

20. The process of claim 19, wherein the at least one layer comprising a high-K dielectric material further comprises at least one additional layer comprising a dielectric material, wherein the at least one additional layer comprising a dielectric material comprises at least one of a standard-K dielectric material, a composite dielectric material, or a second high-K dielectric material.

21. The process of claim 19, wherein the at least one gate layer comprises at least one layer comprising polysilicon or polysilicon-germanium.

22. The process of claim 19, wherein the at least one gate layer comprises one or more of a metal, a silicide, polysilicon or polysilicon-germanium.

23. A process of fabricating a semiconductor device, comprising:
   providing a semiconductor wafer;
   depositing on the semiconductor wafer at least one layer comprising a high-K dielectric material layer; and
   subsequently removing a selected portion of the at least one layer comprising a high-K dielectric material by;
   implanting ions into the selected portion, and
   removing the selected portion by etching,
   wherein the implanted ions increase an etch rate relative to an etch rate without the implanting, and the implanted ions comprise helium, neon, argon, xenon, silicon, germanium, fluorine, chlorine, bromine, iodine or a mixture of two or more thereof.

* * * * *

UNITED STATES PATENT AND TRADEMARK OFFICE
CERTIFICATE OF CORRECTION

PATENT NO.   : 6,764,898 B1
DATED        : July 20, 2004
INVENTOR(S)  : En et al.

It is certified that error appears in the above-identified patent and that said Letters Patent is hereby corrected as shown below:

Column 2,
Line 3, replace "and or" with -- and/or --.
Line 49, replace "layer," with -- layer, --.

Column 6,
Line 39, replace "germaniurn" with -- germanium --.

Column 8,
Line 1, replace "Bi4Si2O12" with -- $Bi_4Si_2O_{12}$ --.
Line 35, replace "there" with -- three --.
Line 52, replace "for" with -- further --.

Column 10,
Line 58, replace "art" with -- art. --.

Column 13,
Line 33, replace "detached" with -- etched --.
Line 55, replace "C2F6" with -- $C_2F_6$ --.

Column 15,
Line 1, replace "implant" with -- implanted --.
Lines 36-37, replace "HBr/Cl2HeO2" with -- $HBr/Cl_2/HeO_2$ --.

Column 16,
Line 4, replace "HBr/Cl2HeO2" with -- $HBr/Cl_2/HeO_2$ --.
Line 10, replace "neon" with -- neon, --.
Line 36, replace "material" with -- material, --.

Signed and Sealed this

Thirtieth Day of November, 2004

JON W. DUDAS
*Director of the United States Patent and Trademark Office*